United States Patent
Malatkar et al.

(10) Patent No.: US 9,414,484 B2
(45) Date of Patent: Aug. 9, 2016

(54) THERMAL EXPANSION COMPENSATORS FOR CONTROLLING MICROELECTRONIC PACKAGE WARPAGE

(75) Inventors: Pramod Malatkar, Chandler, AZ (US); Richard J. Harries, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 205 days.

(21) Appl. No.: 13/992,606

(22) PCT Filed: Nov. 9, 2011

(86) PCT No.: PCT/US2011/059951
§ 371 (c)(1),
(2), (4) Date: Jun. 7, 2013

(87) PCT Pub. No.: WO2013/070207
PCT Pub. Date: May 16, 2013

(65) Prior Publication Data
US 2013/0271929 A1    Oct. 17, 2013

(51) Int. Cl.
| | |
|---|---|
| *H05K 7/00* | (2006.01) |
| *H05K 1/02* | (2006.01) |
| *H01L 23/31* | (2006.01) |
| *H01L 23/00* | (2006.01) |
| *H01L 23/498* | (2006.01) |

(52) U.S. Cl.
CPC .......... *H05K 1/0271* (2013.01); *H01L 23/3128* (2013.01); *H01L 23/49822* (2013.01); *H01L 23/562* (2013.01); *H01L 23/49816* (2013.01); *H01L 2224/16225* (2013.01)

(58) Field of Classification Search
CPC .......... H01L 23/49822; H01L 23/562; H05K 1/0271
USPC .......... 174/256, 259, 260; 361/760
See application file for complete search history.

(56) References Cited

U.S. PATENT DOCUMENTS

| | | | |
|---|---|---|---|
| 8,263,434 B2* | 9/2012 | Pagaila et al. .................. | 438/109 |
| 2004/0222508 A1 | 11/2004 | Aoyagi | |
| 2005/0109534 A1* | 5/2005 | Chengalva et al. ........... | 174/256 |
| 2007/0080441 A1 | 4/2007 | Kirkman et al. | |
| 2007/0246813 A1* | 10/2007 | Ong et al. ...................... | 257/686 |
| 2008/0290491 A1* | 11/2008 | Yamano et al. ................ | 257/686 |
| 2009/0079071 A1* | 3/2009 | Webb ............................. | 257/738 |
| 2011/0062575 A1* | 3/2011 | Lin ................................. | 257/690 |

FOREIGN PATENT DOCUMENTS

| | | |
|---|---|---|
| JP | 10-079405 A | 3/1998 |
| JP | 10079405 * | 3/1998 |
| WO | 2013/070207 A1 | 5/2013 |

OTHER PUBLICATIONS

International Search Report and Written Opinion Received for PCT Patent Application No. PCT/US2011/059951, Mailed on Jul. 2, 2012, 11 pages.
International Preliminary Report on Patentability and Written Opinion received for PCT Patent Application No. PCT/US2011/059951, mailed on May 22, 2014, 8 pages.

* cited by examiner

*Primary Examiner* — Yuriy Semenenko
(74) *Attorney, Agent, or Firm* — Winkle, PLLC

(57) ABSTRACT

The present description relates to the field of fabricating microelectronic packages, wherein a microelectronic device may be attached to a microelectronic substrate with a compensator to control package warpage. The warpage compensator may be a low coefficient of thermal expansion material, including but not limited to silicon or a ceramic material, which is positioned on a land-side of the microelectronic device to counteract the thermal expansion effects of the microelectronic device.

20 Claims, 4 Drawing Sheets

THERMAL EXPANSION COMPENSATORS FOR CONTROLLING MICROELECTRONIC PACKAGE WARPAGE

BACKGROUND

Embodiments of the present description generally relate to the field of microelectronic packages and, more particularly, to incorporation of thermal expansion compensators on a land-side of microelectronic devices within the microelectronic packages to control package warpage.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
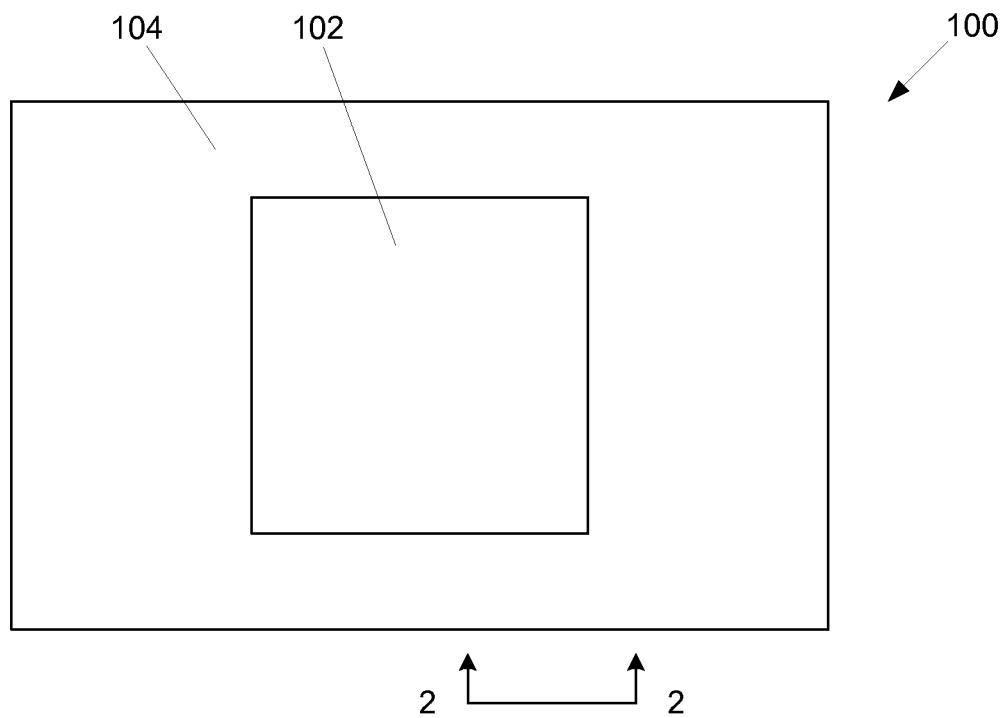
FIG. 1 is a top plan view of a microelectronic device mounted on a microelectronic substrate, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic packages, wherein a microelectronic device may be attached to a microelectronic substrate with a compensator to control package warpage. The warpage compensator may be a low coefficient of thermal expansion material, including but not limited to silicon or a ceramic material, which is positioned on a land-side of the microelectronic device to counteract the thermal expansion effects of the microelectronic device.

Figure 2:
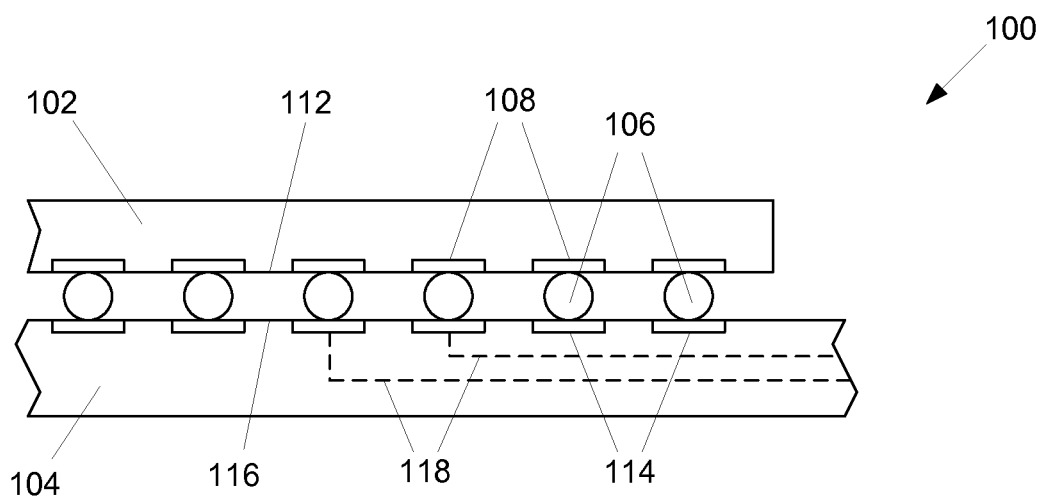
FIG. 2 illustrates a side cross-sectional view along line 2-2 of the structure of FIG. 1, as known in the art.

In the production of microelectronic packages, microelectronic devices are generally mounted on or in substrates, which provide electrical communication routes between the microelectronic devices and external components. As shown in FIGS. 1 and 2, a microelectronic device 102, such as a microprocessor, a chipset, a graphics device, a wireless device, a memory device, an application specific integrated circuit, or the like, may be attached to a microelectronic substrate 104, such as an interposer, a motherboard, and the like, through a plurality of interconnects 106 (see FIG. 2), such as reflowable solder bumps or balls, in a configuration generally known as a flip-chip or controlled collapse chip connection ("C4") configuration, to form a microelectronic package 100. As shown in FIG. 2, the interconnects 106 may extend between bond pads 108 on a land side surface 112 of the microelectronic device 102 and substantially mirror-image bond pads 114 on a device attachment surface 116 of the microelectronic substrate 104. The microelectronic device bond pads 108 may be in electrical communication with integrated circuitry (not shown) within the microelectronic device 102. The microelectronic substrate bond pads 114 may be in electrical communication with conductive routes (shown as dashed lines 118) within the microelectronic substrate 104. The conductive routes 118 provide electrical communication routes to external components (not shown).

The microelectronic substrate 104 may be primarily composed of any appropriate material, including, but not limited to, bismaleimine triazine resin, fire retardant grade 4 material, polyimide materials, glass reinforced epoxy matrix material, and the like, as well as laminates or multiple layers thereof. The conductive routes 118 may be composed of any conductive material, including but not limited to metals, such as copper and aluminum, and alloys thereof. As will be understood to those skilled in the art, the conductive routes 118 may be formed as a plurality of conductive traces (not shown) formed on layers of dielectric material (constituting the layers of the microelectronic substrate material), which are connected by conductive vias (not shown). The interconnects 106 can be made of any appropriate material, including, but not limited to, solders and conductive filled epoxies. Solder materials may be any appropriate material, including but not limited to, lead/tin alloys and high tin content alloys (e.g. 90% or more tin), and similar alloys. When the microelectronic device 102 is attached to the microelectronic substrate 104 with interconnects 106 made of solder, the solder is reflowed, either by heat, pressure, and/or sonic energy to secure the solder between the microelectronic device bond pads 108 and the microelectronic substrate bond pads 114.

In such microelectronic packages, a mismatch of the coefficient of thermal expansion may exist between the microelectronic device 102 and the microelectronic substrate 104. Such a mismatch may cause the microelectronic package 100 to warp at room temperature (about 25 degrees Celsius) and at reflow temperature (for example, about 260 degrees Celsius). Reflow temperature is temperature to which interconnection solder structures are heated to attach to the bond pads between the microelectronic device 102 and the microelectronic substrate 104, or other interconnection solder structures to attach the microelectronic package 100 to external devices, as will be discussed. Such warpage may result in interconnection (e.g. solder) joint opens and/or interconnection (e.g. solder) bridging during the reflow process. As will be understood to those skilled in the art, the risk of interconnection joint opens/bridging may be greater in large form-factor microelectronic packages, in microelectronic packages having relatively large microelectronic devices therein, in microelectronic packages having relatively thin microelectronic devices (for example, device thicknesses less than about 125 µm), in microelectronic packages having thin-core or coreless substrates, and in solder grid array (SGA) microelectronic packages.

Embodiments of the present description relate to the use of thermal expansion compensators incorporated into a microelectronic package on the land side of the microelectronic device. Such embodiments may counter shear stress and thermal moment arising from the coefficient of thermal expansion mismatch between the microelectronic device and the microelectronic substrate without significantly impacting the microelectronic package height/thickness or significantly decreasing interconnection joint reliability.

Figure 3:
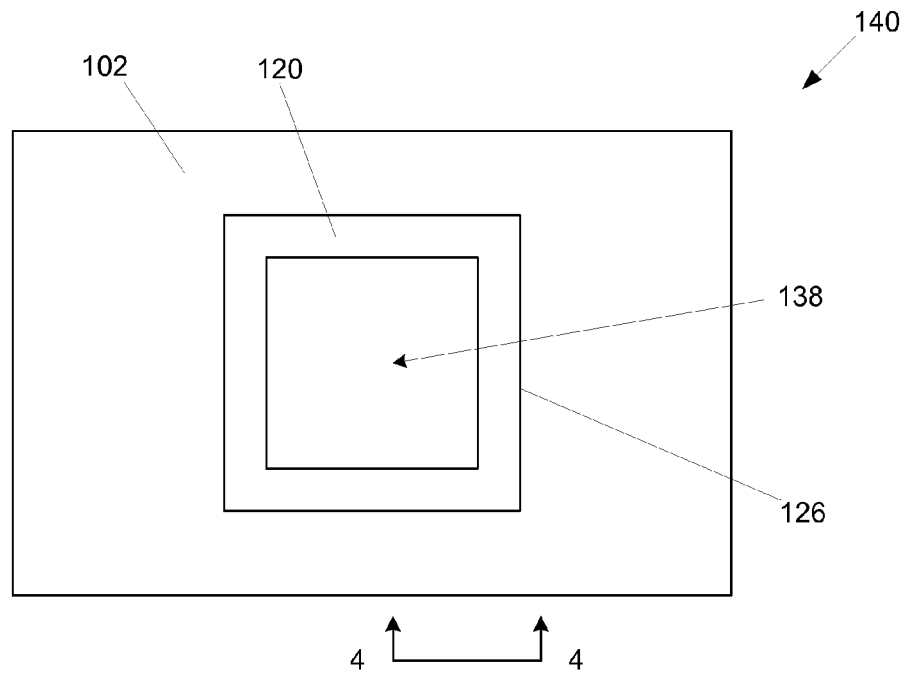
FIG. 3 is a bottom plan view of the microelectronic substrate of FIG. 1 with a warpage compensator attached to a back surface of the microelectronic substrate, according to an embodiment of the present description.
Figure 4:
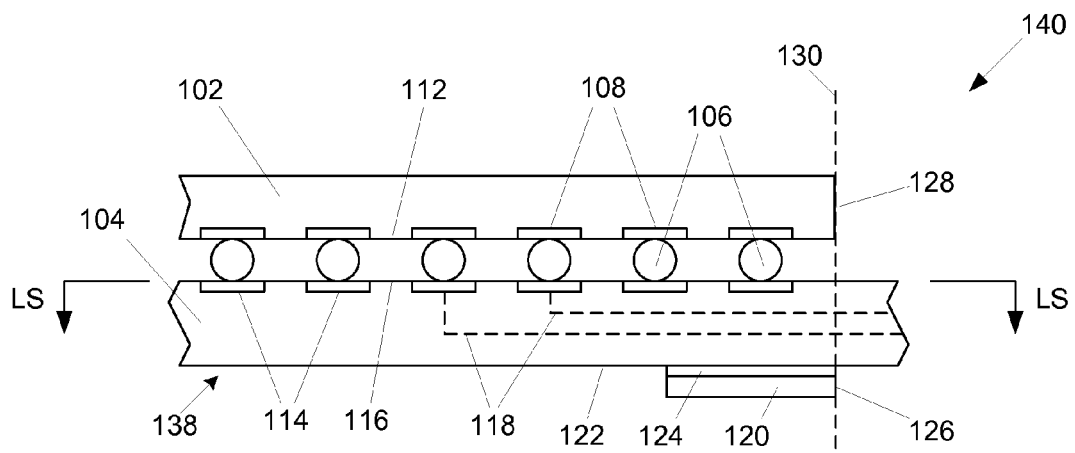
FIG. 4 illustrates a side cross-sectional view along line 4-4 of the structure of FIG. 3, according to an embodiment of the present description.

As shown in FIGS. 3 and 4, a warpage compensator 120 may be attached to a back surface 122 (opposing the microelectronic substrate device attachment surface 116) of the microelectronic substrate 104 (such as with an adhesive, not shown), which is on the land side of the microelectronic device 102 (illustrated as arrows LS in FIG. 4). In one embodiment, a periphery 126 of the warpage compensator 120 may be substantially planar to a periphery 128 of the microelectronic device 102 (shown as dashed line 130). In another embodiment, the warpage compensator 120 may have an opening 138 within a center portion thereof. Although the warpage compensator 120 is illustrated as a square having a square opening thererin, it is understood that the warpage compensator 120 may be any appropriate shape or size, including but not limited to, rectangular, circular, triangular, etc., and may or may not have an opening 138 formed therein. It is further understood that dimensions for the warpage compensator 120 may be optimized based on the size and thickness of the microelectronic device 102, as well as optimized based on the number of microelectronic device 102 in the microelectronic package 100, such a in a multi-chip package (MCP). It is still further understood that the warpage compensator 120 may be used with any size/thickness of microelectronic device 102 and/or microelectronic substrate 104.

In one embodiment, the warpage compensator 120 may have substantially the same coefficient of thermal expansion as the microelectronic device 102. In another embodiment, the warpage compensator 120 may be substantially the same material as the material used to form the microelectronic device, such as a silicon-containing material, including but not limited, a silicon monocrystalline material, amorphous silicon, and fused silica, and other types of substrates, such as a germanium, a gallium arsenide, indium antimonide, lead telluride, indium arsenide, indium phosphide, gallium arsenide, gallium antimonide, and the like, any of which may be combined with silicon. In still another embodiment, the warpage compensator 120 may be a ceramic material, such as silicon carbide, silicon nitride, aluminum nitride, and ceramic glass. The warpage compensator 120 may also include materials such as alumina and nickel steel alloy (e.g. FeNi36 or 64FeNi).

In one embodiment, the warpage compensator 120 may be functional microelectronic device, rather a non-functional device, as described above. For example, the warpage compensator 120 may be a passive microelectronic device, such as a capacitor, a voltage regulator, or the like, or may even be an active microelectronic device, as another microelectronic device.

Figure 5:
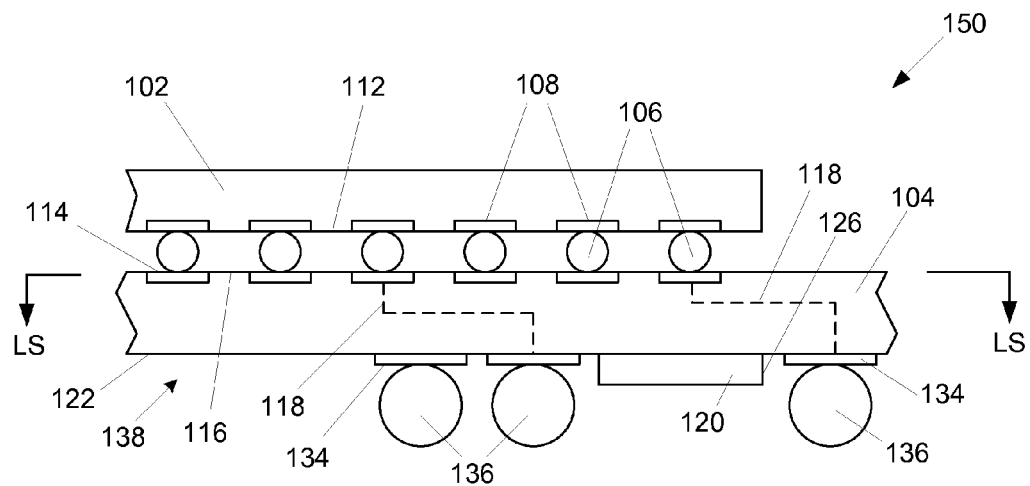
FIG. 5 illustrates a side cross-sectional view along line 4-4 of the structure of FIG. 3 having external interconnects disposed on the microelectronic substrate back surface, according to an embodiment of the present description.

FIG. 5 illustrates a microelectronic package 150 wherein the microelectronic substrate 104 may be an interposer, such that the conductive routes 118 extend through the microelectronic substrate 104 to connect to the microelectronic substrate bond pads 114 to external connection bond pads 134 proximate the microelectronic substrate back surface 122. A plurality of external interconnects 136, such as reflowable solder bumps or balls, may be attached to the external connection bond pads 134 for attaching the microelectronic package 150 to external devices (not shown). As shown, the external connection bond pads 134 and the external interconnects 136 may be positioned about the warpage compensator periphery 126 and may be positioned within the warpage compensator opening 138. It is understood that although the warpage compensator 120 is shown in FIG. 5 as mounted directly on the microelectronic substrate 104 without modification thereto, the microelectronic substrate 104 may be modified (such as forming cut-out) to accommodate the warpage compensator 120.

Figure 6:
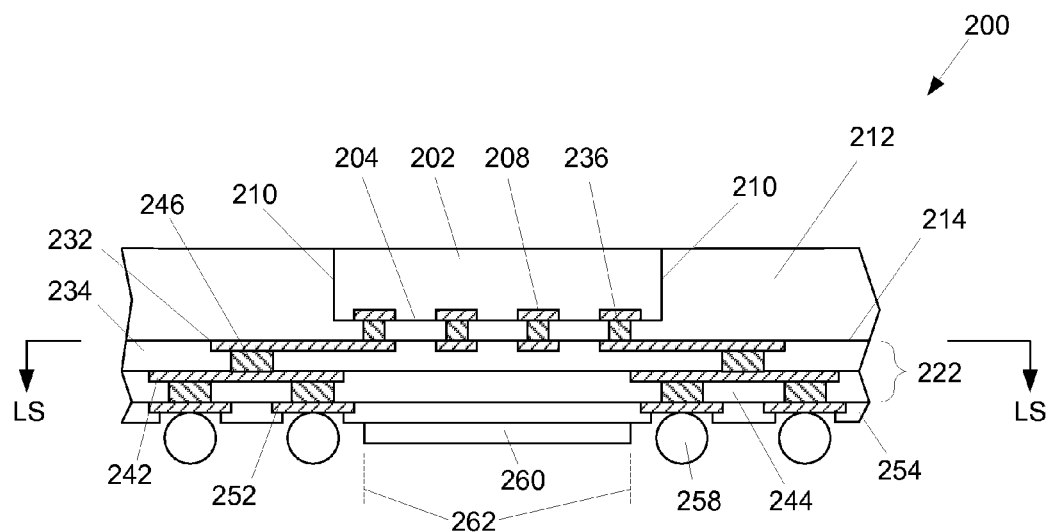
FIG. 6 illustrates a side cross-sectional view of an embedded microelectronic device structure having a warpage compensator attached to an external connection side of a build-up layer of the microelectronic package, according to an embodiment of the present description.

FIG. 6 illustrates a cross-sectional view of an embodiment of a bumpless build-up layer coreless (BBUL-C) microelectronic package, according to an embodiment of the present description. As shown in FIG. 6, a microelectronic package 200 may include a microelectronic device 202 substantially encased in an encapsulation material 212, wherein the encapsulation material 212 may abut at least a portion of a land side surface 204 of the microelectronic device 202 and at least one side 210 of the microelectronic device 202. The microelectronic device land side surface 204 may have at least one contact land 208 formed therein and/or thereon. The microelectronic device 202 may be any desired device, including but not limited to a microprocessor (single or multi-core), a memory device, a chipset, a graphics device, an application specific integrated circuit, or the like. The encapsulation material 212 may be a silica-filled epoxy, such as build-up films available from Ajinomoto Fine-Techno Co., Inc., 1-2 Suzuki-cho, Kawasaki-ku, Kawasaki-shi, 210-0801, Japan (e.g. Ajinomoto ABF-GX13, Ajinomoto GX92, and the like).

A build-up layer 222 may be formed on a first surface 214 of the encapsulation material 212 proximate the microelectronic device land side surface 204. The build-up layer 222 may comprise a plurality of dielectric layers with conductive traces formed adjacent each dielectric layer with conductive vias extending through each dielectric layer to connect the conductive traces on different layers. Referring to FIG. 6, the build-up layer 222 may comprise at least one first layer conductive trace 232 with a first build-up dielectric layer 234 formed adjacent the first layer conductive trace 232 and the encapsulation material 212. At least one trace-to-device conductive via 236 may extend through the first build-up dielectric layer 234 to connect at least one first layer conductive trace 232 to at least one microelectronic device contact land 208. At least one second layer conductive trace 242 may be formed adjacent the first build-up dielectric layer 234 and a second build-up dielectric layer 244 may be formed adjacent the second layer conductive traces 242 and the first build-up dielectric layer 234. At least one trace-to-trace conductive via 246 may extend through the first build-up dielectric layer 234 to connect at least one first layer conductive trace 232 to at least one second layer conductive trace 242. At least one external connection bond pad 252 may be formed on the second build-up dielectric layer 244 and at least one trace-to-trace conductive via 246 may extend through the second build-up dielectric layer 244 to connect at least one second layer conductive trace 242 to at least one external connection bond pad 252. Thus, the combination of the encapsulation material 212 and the build-up layer 222 is substantially analogous to the microelectronic substrate 104 of FIGS. 3-5.

A solder resist material 254 may be patterned on the second build-up dielectric layer 244 and external connection bond pad 252 to expose at least a portion of each external connection bond pad 252. A plurality of external interconnects 258, such as reflowable solder bumps or balls, may be attached to the external connection bond pads 252 for attaching the microelectronic package 200 to external devices (not shown).

A warpage compensator 260 may be positioned proximate a final build-up dielectric layer (illustrated as second build-up dielectric layer 244), which is farthest build-up dielectric layer from the microelectronic device 102. As illustrated, the warpage compensator 260 may be attached to the solder resist material 254.

Figure 7:
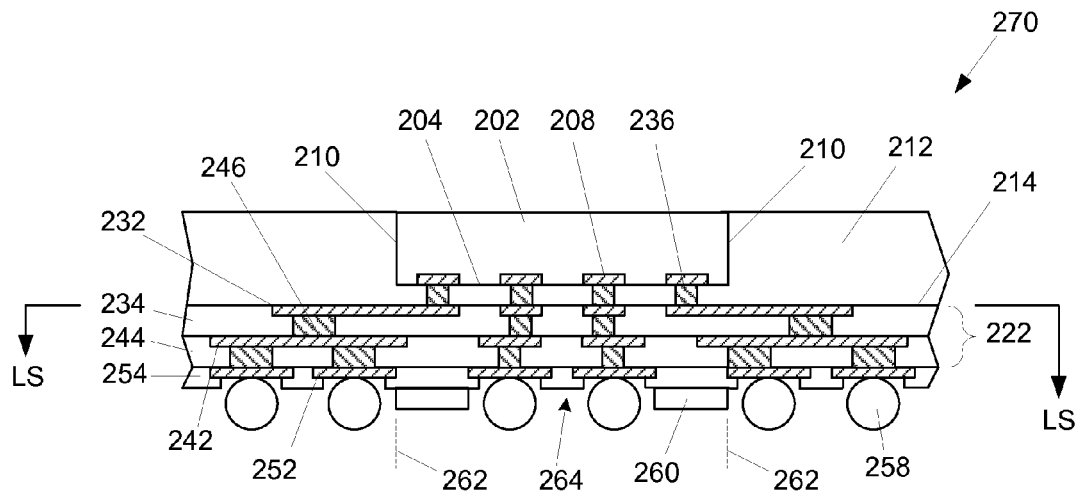
FIG. 7 illustrates a side cross-sectional view of an embedded microelectronic device structure having a warpage compensator attached to an external connection side of a build-up layer of the microelectronic package, according to another embodiment of the present description.

As further shown in FIG. 6, the external connection bond pads 252 and the external interconnects 258 may be positioned about a periphery 262 of the warpage compensator 260. As shown in FIG. 7, the external connection bond pads 252 and the external interconnects 258 may be positioned about the warpage compensator periphery 262 and may be positioned within a warpage compensator opening 264 to form a microelectronic package 270, such as shown and discussed with regard to FIGS. 3 and 4.

Figure 8:
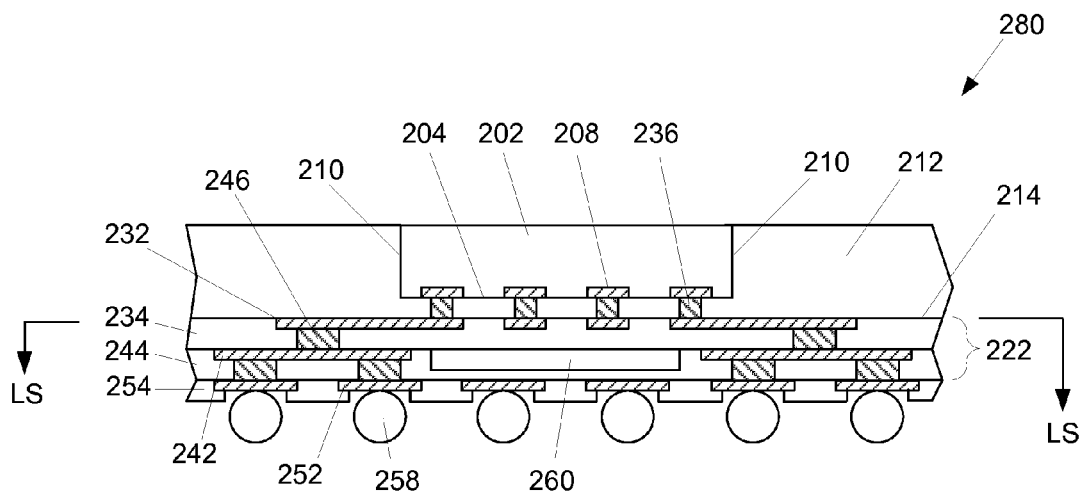
FIG. 8 illustrates a side cross-sectional view of an embedded microelectronic device structure having a warpage compensator embedded within a build-up layer of the microelectronic package, according to an embodiment of the present description.

As shown in FIG. 8, the warpage compensator 260 may be positioned within the build-up layer 222. As shown in FIG. 8, the warpage compensator 260 may be positioned adjacent the first build-up dielectric layer 234. In one embodiment, the warpage compensator 260 may be held in place with a die backside film (DBF) and copper, as will be understood to those skilled in the art. In another embodiment, if no die backside film and copper structure is used to hold the warpage compensator 260, the first build-up dielectric layer 234 may be cured after the placement of the warpage compensator 260.

It is understood that the subject matter of the present description is not necessarily limited to specific applications illustrated in FIGS. 1-8. The subject matter may be applied to other microelectronic device fabrication applications, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof

What is claimed is:

1. A microelectronic package, comprising:
   a microelectronic interposer has at least one conductive route extending from a device attachment surface of the microelectronic interposer to an opposing back surface of the microelectronic interposer;
   a microelectronic device attached to the microelectronic interposer device attachment surface; and
   a warpage compensator attached to the microelectronic interposer back surface, wherein a periphery of the warpage compensator includes a periphery that is substantially planar to a periphery of the microelectronic device and wherein the warpage compensator includes an opening therethrough.

2. The microelectronic package of claim 1, wherein the warpage compensator has substantially the same coefficient of thermal expansion as the microelectronic device.

3. The microelectronic package of claim 1, wherein the warpage compensator is substantially the same material as a material used to form the microelectronic device.

4. The microelectronic package of claim 1, wherein the warpage compensator comprises a silicon-containing material.

5. The microelectronic package of claim 1, wherein the warpage compensator comprises a ceramic material.

6. The microelectronic package of claim 5, wherein the ceramic material may be selected from the group comprising silicon carbide, silicon nitride, aluminum nitride, and ceramic glass.

7. The microelectronic package of claim 1, wherein the microelectronic device is attached to the microelectronic interposer device attachment surface with a plurality of interconnects extending between bond pads on the microelectronic device land side surface and bond pads on the microelectronic interposer device attachment surface.

8. The microelectronic package of claim 1, wherein the plurality of interconnects comprise a plurality of solder interconnect.

9. The microelectronic package of claim 1, further including a plurality of external interconnects disposed on the microelectronic interposer back surface.

10. The microelectronic package of claim 9, wherein at least one of the plurality of external interconnects is disposed proximate the periphery of the warpage compensator.

11. The microelectronic package of claim 9, wherein at least one of the plurality of external interconnects is disposed within and extends through the warpage compensator opening.

12. The microelectronic package of claim 4, wherein the warpage compensator comprises a silicon-containing material selected from the group consisting of a silicon monocrystalline material, amorphous silicon, and fused silicon.

13. The microelectronic package of claim 1, wherein the warpage compensator comprises a material selected from the group consisting of germanium, gallium arsenide, indium antimonide, lead telluride, indium arsenide, indium phosphide, and gallium antimonide.

14. The microelectronic package of claim 1, wherein the warpage compensator comprises alumina.

15. The microelectronic package of claim 1, wherein the warpage compensator comprises a nickel steel alloy.

16. A microelectronic package, comprising:
- a microelectronic interposer has at least one conductive route extending from a device attachment surface of the microelectronic interposer to an opposing back surface of the microelectronic interposer;
- a microelectronic device attached to the microelectronic interposer device attachment surface;
- a warpage compensator attached to the microelectronic interposer back surface, wherein a periphery of the warpage compensator includes a periphery that is substantially planar to a periphery of the microelectronic device and wherein the warpage compensator includes an opening therethrough;
- a plurality of external interconnects disposed on the microelectronic interposer back surface, wherein at least one of the plurality of external interconnects is disposed proximate the periphery of the warpage compensator, and wherein at least one of the plurality of external interconnects is disposed within and extends through the warpage compensator opening.

17. The microelectronic package of claim 16, wherein the warpage compensator has substantially the same coefficient of thermal expansion as the microelectronic device.

18. The microelectronic package of claim 16, wherein the warpage compensator is substantially the same material as a material used to form the microelectronic device.

19. The microelectronic package of claim 16, wherein the warpage compensator comprises a silicon-containing material.

20. The microelectronic package of claim 16, wherein the microelectronic device is attached to the microelectronic interposer device attachment surface with a plurality of interconnects extending between bond pads on the microelectronic device land side surface and bond pads on the microelectronic interposer device attachment surface.

* * * * *